(12) United States Patent
Liao et al.

(10) Patent No.: US 8,222,062 B2
(45) Date of Patent: Jul. 17, 2012

(54) METHOD FOR FABRICATING A FLEXIBLE DISPLAY DEVICE

(75) Inventors: Wei-Lun Liao, Miao-Li County (TW); Guan-Hua Yeh, Miao-Li County (TW); Hsiao-Ping Lai, Miao-Li County (TW); Hong-Gi Wu, Miao-Li County (TW)

(73) Assignee: Chimei Innolux Corporation, Miao-Li County (TW)

( * ) Notice: Subject to any disclaimer, the term of this patent is extended or adjusted under 35 U.S.C. 154(b) by 12 days.

(21) Appl. No.: 12/860,913

(22) Filed: Aug. 22, 2010

(65) Prior Publication Data

US 2011/0059561 A1 Mar. 10, 2011

(30) Foreign Application Priority Data

Sep. 8, 2009 (CN) .......................... 2009 1 0306699

(51) Int. Cl.
*H01L 21/00* (2006.01)

(52) U.S. Cl. ................... 438/34; 438/478; 257/E21.134
(58) Field of Classification Search .................. 438/34, 438/487; 257/E21.134
See application file for complete search history.

(56) References Cited

U.S. PATENT DOCUMENTS

| | | | |
|---|---|---|---|
| 6,737,145 B1 * | 5/2004 | Watanabe et al. | 428/64.4 |
| 2004/0053449 A1 * | 3/2004 | Chang et al. | 438/149 |
| 2009/0258169 A1 * | 10/2009 | Liao et al. | 427/597 |
| 2009/0266471 A1 * | 10/2009 | Kim et al. | 156/67 |
| 2009/0269874 A1 * | 10/2009 | Huang et al. | 438/34 |
| 2011/0171426 A1 * | 7/2011 | Chen et al. | 428/141 |

* cited by examiner

*Primary Examiner* — Phuc Dang
(74) *Attorney, Agent, or Firm* — WPAT., P.C.; Justin King

(57) ABSTRACT

A method for fabricating a flexible display device includes providing a carrier substrate, forming a sacrificial layer on the carrier substrate, forming a metal layer and a buffer layer on the sacrificial layer in that order, forming at least one active device on the buffer layer, and separating the metal layer and the carrier substrate by laser treatment.

12 Claims, 9 Drawing Sheets

METHOD FOR FABRICATING A FLEXIBLE DISPLAY DEVICE

CROSS-REFERENCE TO RELATED APPLICATION

This application is related to, and claims the benefit of, a foreign priority application filed in China as Serial No. 200910306699.3 on Sep. 8, 2010. The related application is incorporated herein by reference.

BACKGROUND

1. Technical Field

The present disclosure relates to display technology, and more particularly to a method for fabricating a flexible display device.

2. Description of Related Art

In recent years, scientists and engineers have been enticed by the vision of flexible displays. A flexible display defined in this disclosure is a flat-panel display using a thin and flexible substrate, which can be bent to have a radius of curvature of a few centimeters or less without the loss of functionality. Flexible displays are considered to be more attractive than conventional rigid displays, since they allow more freedom in design and promise smaller and more rugged devices.

The flexible thin film transistor (TFT) substrate is one of the most important components of the flexible displays, and on which considerable attention has been focused. Conventionally, flexible substrates, such as a plastic substrate, thin glass substrate or metal foil substrate, have been utilized to provide a mechanical flexibility to display devices. However, during the high temperature process of forming an active device such as TFT directly on a plastic substrate, the plastic substrate having a glass transition temperature of less than 200° C. is subjected to dimensional instability. In addition, the thin glass substrate suffers from several disadvantages such as higher cost and lower impact resistance.

The metal foil substrate provides higher heat resistance, higher solvent resistance, lower thermal expansion coefficient, good flexibility, higher strength, and good gas permeability resistance, such that it is an optimal substrate material for flexible TFT display devices. However, a major problem using the metal foil substrate is higher surface roughness. FIG. 9 is a schematic, partial, cross-section of a conventional metal flexible TFT substrate. The metal flexible TFT substrate 100 includes a metal substrate 102 and an active device 106. However, it is very difficult to form the active device 106 directly on the metal substrate 102 since the metal substrate 102 has reduced surface flatness by having a root mean square (RMS) exceeding 1000 Å. In addition, some peaks 104 formed on a surface of the metal substrate 102 may be detrimental to the properties of the active device 106. In order to overcome the above described limitation, polishing techniques have been utilized to decrease the surface roughness of the metal substrate 102. Such techniques include chemical mechanical polishing (CMP), electro chemical polishing (ECP), and super mirror methods. In an alternate solution, an insulating buffer layer 108, which can prevent contamination by the particles 110, is formed between the metal substrate 102 and the active device 106.

It should be noted that the buffer layer 108 still presents certain disadvantages. For example, in order to cover all of the peaks 104 and decrease the surface roughness, the buffer layer 108 must normally be formed at a greater thickness (1~5 mm), which is a time-consuming and costly requirement. Furthermore, as thickness increases, the buffer layer 108 tends to crack due to stress, due to the frequent presence of inorganic materials such as silicon oxide.

Therefore, a method for fabricating a flexible display device is desired to overcome the described limitations.

SUMMARY

An exemplary method for fabricating a flexible display device includes providing a carrier substrate, forming a sacrificial layer on the carrier substrate, forming a metal layer and a buffer layer on the sacrificial layer in that order, forming at least one active device on the buffer layer, and separating the metal layer and the carrier substrate by laser treatment.

Other advantages and novel features will become more apparent from the following detailed description of various embodiments, when taken in conjunction with the accompanying drawings.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
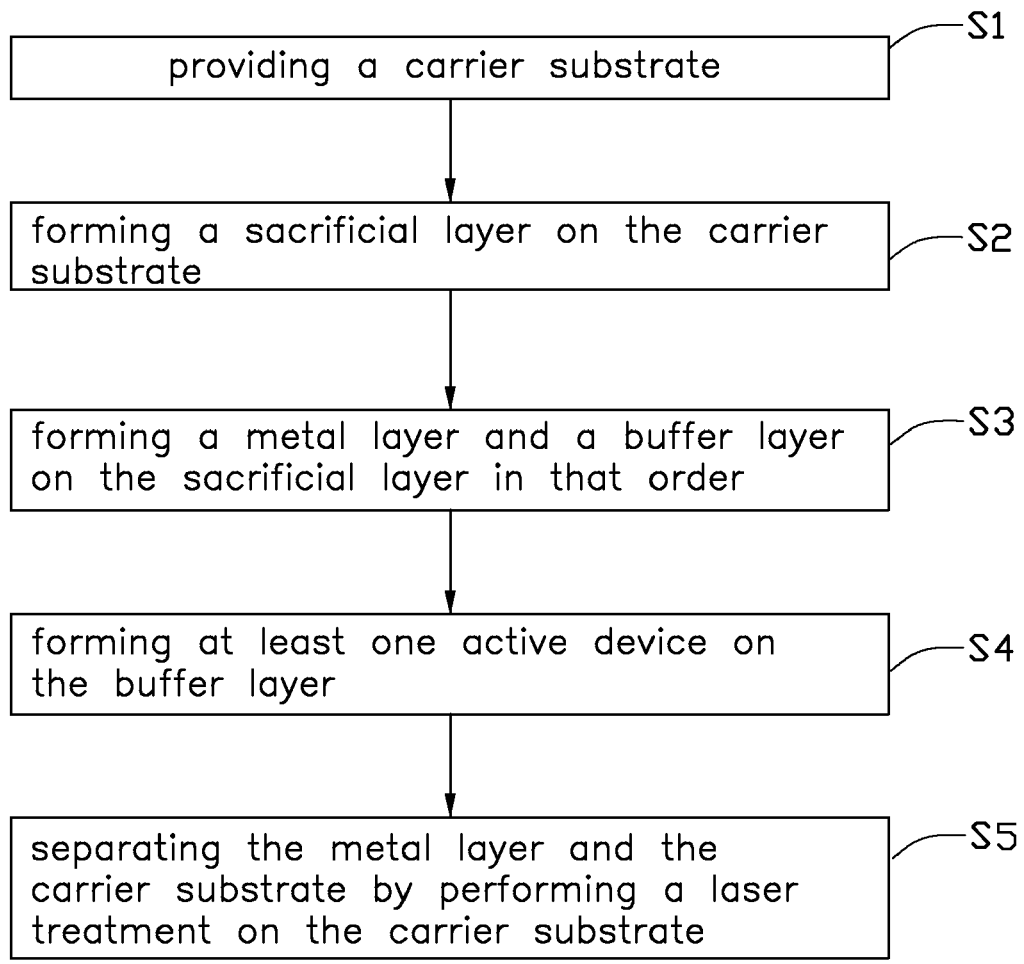
FIG. 1 is a flowchart summarizing an embodiment of a method for fabricating a flexible display device.

FIG. 1 shows an embodiment of a method for fabricating a flexible display device as follows. A carrier substrate is provided (step S1). A sacrificial layer is formed on the carrier substrate (step S2). A metal layer and a buffer layer are formed on the sacrificial layer in that order (step S3). At least one active device is formed on the buffer layer (step S4); and the metal layer and the carrier substrate are separated by a laser treatment (step S5).

Figure 2:
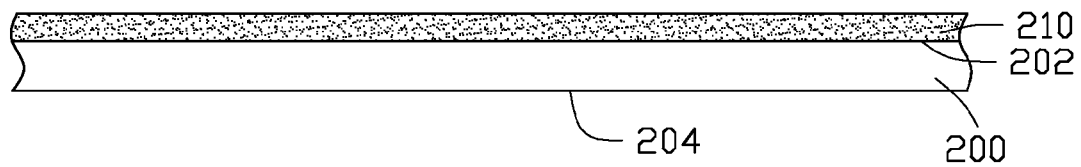
FIG. 2 through FIG. 8 are a plurality of schematic cross-sections of at least one part of a flexible display device, with each figure corresponding to at least one fabricating step of the method of FIG. 1.

In step S1, referring to FIG. 2, the carrier substrate 200 is provided. The carrier substrate 200 includes a first surface 202 and a second surface 204 opposite to the first surface 202. The carrier substrate 200 is a transparent substrate, and may contain transparent materials such as glass, quartz or sapphire. The sacrificial layer 210 is formed on the first surface 202 of the carrier substrate 200. A thickness of the sacrificial layer 210 is less than 500 Å. In the illustrated embodiment, the sacrificial layer 210, which contains amorphous silicon (a-Si), is formed on the first surface 202 via chemical vapor deposition (CVD). It should be noted that during the CVD process, silane and hydrogen are added to increase the content of the hydrogen in the sacrificial layer 210. Furthermore, a hydrogen ion implantation or a hydrogen ion plasma treatment may be performed after the chemical vapor deposition process to increase the content of the hydrogen in the sacrificial layer 210.

Figure 3:
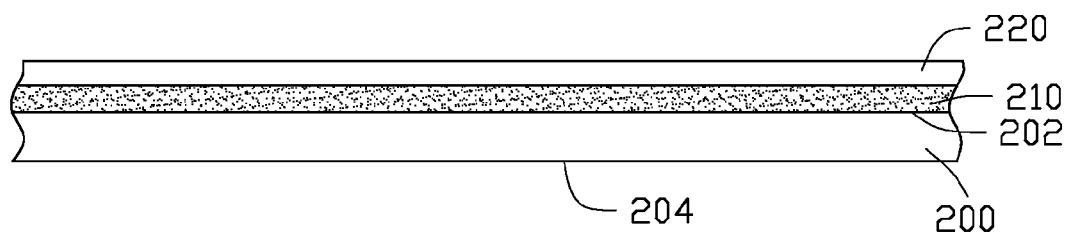

In step S2, referring to FIG. 3, the metal layer 220 is formed on the sacrificial layer 210. In the illustrated embodiment, the metal layer 220, which contains stainless steel, is formed on the sacrificial layer 210 via sputtering or silver paste coating. It should be noted that an improved flatness of the metal layer 220 due to the sputtering or silver paste coating, and a thickness of the metal layer 220 of less than 2 μm can be achieved.

Figure 4:
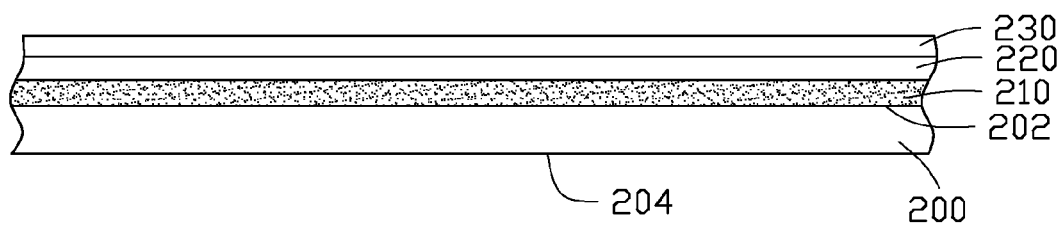

In step S3, referring to FIG. 4, the buffer layer 230 is then formed on the metal layer 220. The buffer layer 230 is formed to flatten the surface of the metal layer 220, and to avoid capacitance coupling caused by the metal layer 220 with the active devices formed in the following steps. The buffer layer 230 may contain insulated organic materials or inorganic materials. The inorganic materials may include silicon dioxide or silicon nitride, such that the metal layer 220 is insulated from active devices. It should be noted that the buffer layer 230 does not need to increase its thickness to conform to the metal layer 220, since the flatness of the surface of the metal layer 220 is already sufficient. When the buffer layer 230 contains organic materials, the thickness of the buffer layer 230 is within several micrometers. When the buffer layer 230 contains inorganic materials such as silicon dioxide, the thickness of the buffer layer 230 may decrease to less than thousands of Ångstroms. Therefore, the flexibility of the flexible display device is not affected by the buffer layer 230. Compared to the silicon dioxide layer of many commonly used flexible display devices, stress on the silicon dioxide layer of the present disclosure is minimized by having the thickness of the silicon dioxide layer to be remaining less than thousands of Ångstroms. Thus, the buffer layer 230 fabricated according to the present method is less likely to crack.

In step S4, at least one active device is then formed on the buffer layer 230. The active device may have a plurality of different structures according to a plurality of different integrated designs. Referring to the FIGS. 5-7, an embodiment of active device includes a thin film transistor (TFT) 240 and a pixel electrode 260.

Figure 5:
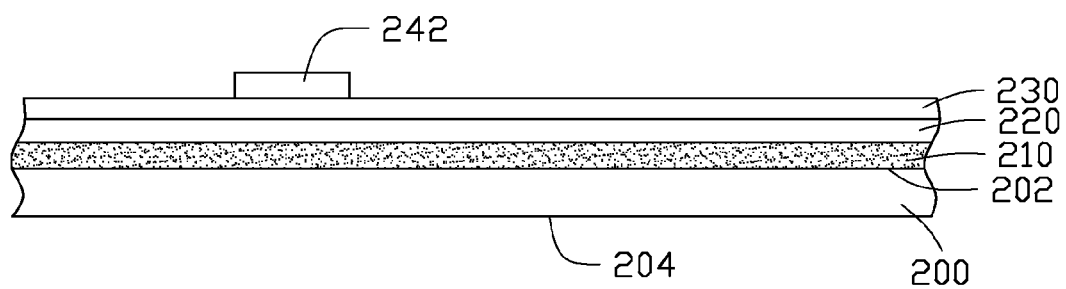
Figure 6:
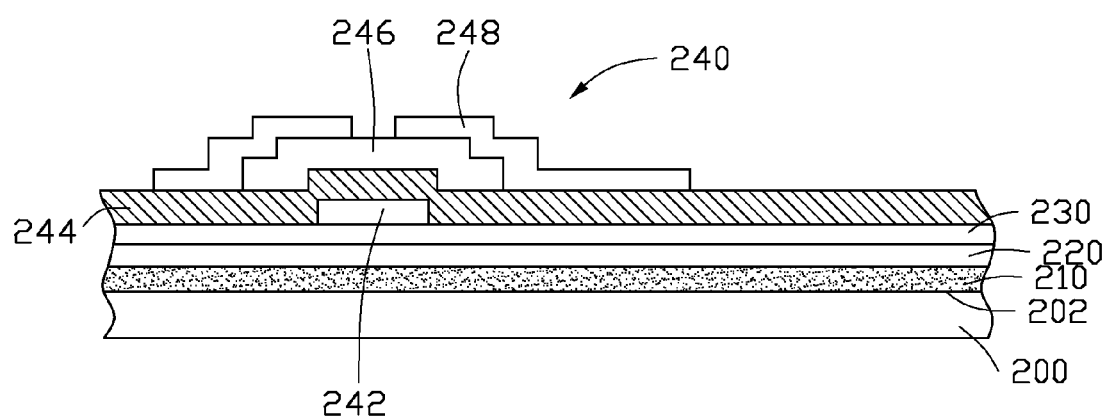
Figure 7:
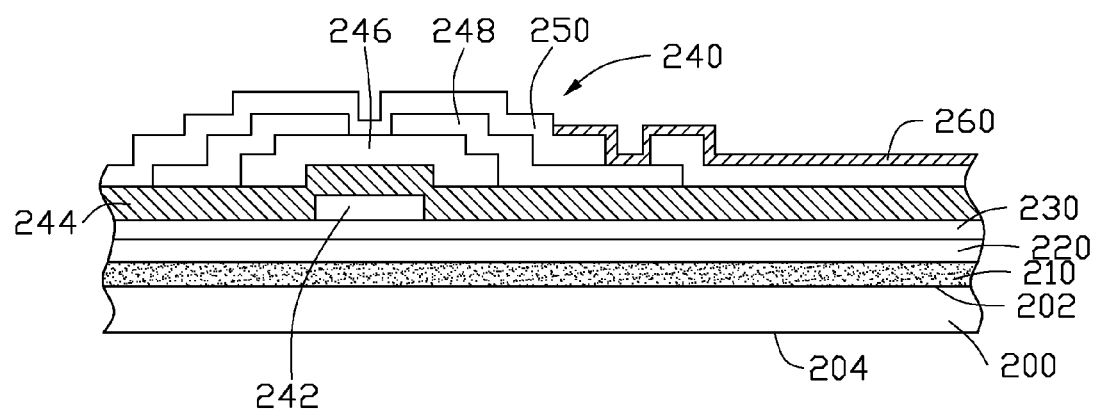

Referring to FIG. 5, a gate metal layer 242 is formed on the buffer layer 230. Referring to FIG. 6, a gate insulating layer 244, a semiconductor layer 246, and a source/drain electrode metal layer 248 are then formed on the gate metal layer 242 in that order. Referring to FIG. 7, a back-channel passivation (BP) layer 250 having an opening pattern, such as an insulating silicon nitride layer, is formed on the source/drain electrode metal layer 248 and the gate insulating layer 244. The pixel electrode 260, such as an indium tin oxide (ITO) layer or an indium zinc oxide (IZO) layer, is formed on the BP layer 250 and electrically connected to the source/drain electrode metal layer 248 through the opening of the BP layer 250. Each layer of the TFT 240 and the pixel electrode 260 can be formed by conventional photo-etching process (PEP).

Figure 8:
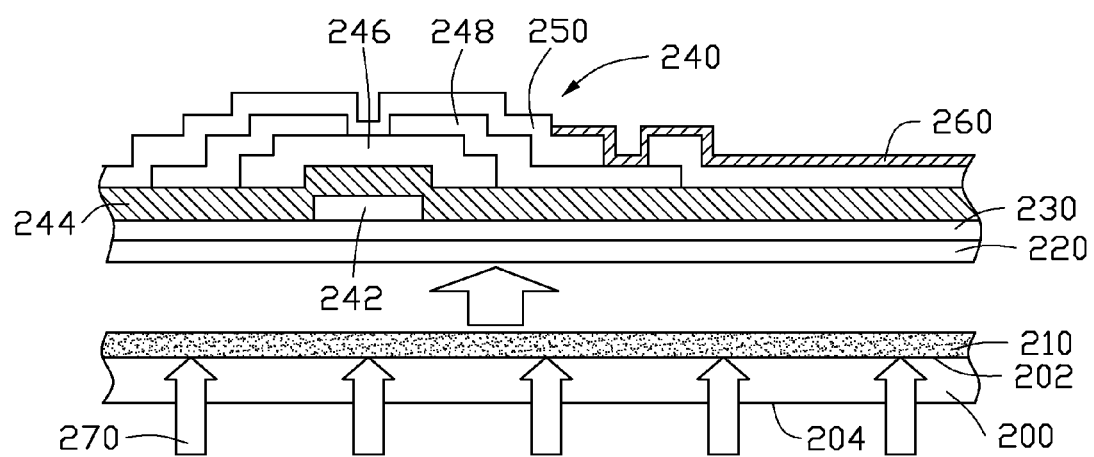
Figure 9:
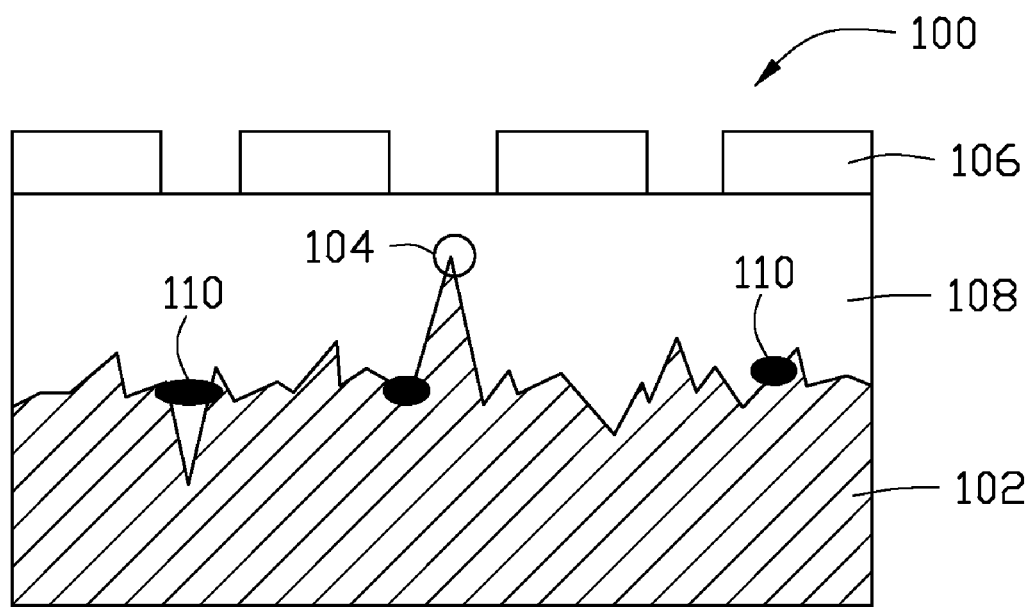
FIG. 9 is a schematic, partial, cross-section of a conventional metal flexible TFT substrate.

In step S5, referring to FIG. 8, the carrier substrate 200 is separated from the metal layer 220 when the active devices, such as the TFT 240 and the pixel electrode 260, are formed. In the illustrated embodiment, the separation is performed via a laser treatment 270, such as a XeCl excimer laser treatment. During the laser treatment 270, a laser with a wavelength of 308 nm is applied to the second surface 204 of the carrier substrate 200. The laser passes through the second surface 204 and reaches the sacrificial layer 210, since the carrier substrate 200 is transparent. In other words, during the laser treatment 270, energy of the laser is absorbed by the sacrificial layer 210, and the amorphous silicon in the sacrificial layer 210 transforms or changes to polysilicon. At the same time, the hydrogen atoms inside the sacrificial layer 210 are released and a hydrogen decrepitation occurs, such that the carrier substrate 200 is separated from the metal layer 220. After the separation, the remaining metal layer 220 is suitable to function as a flexible substrate. In addition, the sacrificial layer 210, despite the separation from the metal layer 220, is still attached to the carrier substrate 200. And the cost of the carrier substrate 200 is reduced, since the carrier substrate 200 can be reused after the sacrificial layer 210 is removed.

According to the present disclosure, the rigid carrier substrate 200 is provided, and the sacrificial layer 210, the metal layer 220, the buffer layer 230, and the active device such as the TFT 240 are then formed on the carrier substrate 200, such that a relatively high yield rate is obtained. After that, the carrier substrate 200 is separated from the metal layer 220 via the laser treatment 270, and a flexible metal substrate is finally obtained. The metal layer 220 has an optimal flatness since it is formed on the sacrificial layer 210 via sputtering or silver paste coating, such that the thickness of the buffer layer 230 formed on the metal layer 220 decreases, and some of the limitations such as stress and cracking of the buffer layer 230 due to higher thickness can be overcome.

The flexible display device fabricated by the described method provides better heat resistance, lower thermal expansion coefficient, better protection against moisture and oxygen, lower electrostatic effect, and other benefits. The flexible display device is not only suitable for use as a substrate of the conventional TFT-LCD, but also as other displays, such as organic light-emitting diode (OLED), and being capable of resolving problems of the organic light-emitting materials of the OLED such as sensitivity to moisture or oxygen.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A method for fabricating a flexible display device, comprising:
    providing a carrier substrate with a first surface;
    forming a sacrificial layer, containing amorphous silicon, on said first surface of the carrier substrate via chemical vapor deposition;
    forming a metal layer and a buffer layer on the sacrificial layer in that order;
    forming at least one active device on the buffer layer, and
    separating the metal layer and the carrier substrate by a laser treatment.

2. The method of claim 1, wherein the carrier substrate is a transparent substrate.

3. The method of claim 1, wherein the chemical vapor deposition process comprises adding silane and hydrogen to the sacrificial layer.

4. The method of claim 1, further comprising performing hydrogen ion implantation after the chemical vapor deposition process to increase the content of hydrogen in the sacrificial layer.

5. The method of claim 1, further comprising performing a hydrogen ion plasma treatment after the chemical vapor deposition process to increase the content of the hydrogen in the sacrificial layer.

6. The method of claim 1, wherein a thickness of the sacrificial layer is less than 500 Å.

7. The method of claim 1, wherein the metal layer comprises stainless steel.

8. The method of claim 7, wherein the metal layer is formed on the sacrificial layer via sputtering or silver paste coating.

9. The method of claim 1, wherein a thickness of the metal layer is less than 2 .mu.m.

10. The method of claim 1, wherein the buffer layer comprises organic or inorganic materials.

11. The method of claim 1, wherein the laser treatment is a XeCl excimer laser treatment.

12. A method for fabricating a flexible display device, comprising:
  providing a carrier substrate;
  forming a sacrificial layer on the carrier substrate, the sacrificial layer comprising amorphous silicon;
  forming a metal layer and a buffer layer on the sacrificial layer in that order:
  forming at least one active device on the buffer layer, and
  separating the metal layer and the carrier substrate by a laser treatment wherein the amorphous silicon is changed to polysilicon after the laser treatment.

* * * * *